(12) United States Patent
Thome et al.

(10) Patent No.: US 7,261,144 B2
(45) Date of Patent: Aug. 28, 2007

(54) BUBBLE GENERATOR

(75) Inventors: John R. Thome, Pully (CH); Vincent Dupont, Waterloo (BE)

(73) Assignee: Ecole Polytechnique Fédérale de Lausanne (EPFL), Lausanne (CH)

( * ) Notice: Subject to any disclaimer, the term of this patent is extended or adjusted under 35 U.S.C. 154(b) by 379 days.

(21) Appl. No.: 10/940,391

(22) Filed: Sep. 14, 2004

(65) Prior Publication Data
US 2005/0279491 A1    Dec. 22, 2005

(30) Foreign Application Priority Data
Jun. 18, 2004  (EP)  .................................. 04405374

(51) Int. Cl.
*F28D 15/06*    (2006.01)
*H05K 7/20*    (2006.01)

(52) U.S. Cl. ........................ 165/104.29; 165/104.21; 165/104.23

(58) Field of Classification Search ........... 165/104.23, 165/104.24, 104.21, 104.29, 104.33, 274, 165/287, 80.4; 361/699–700; 347/54–55, 347/61, 14, 17–18
See application file for complete search history.

(56) References Cited

U.S. PATENT DOCUMENTS

| | | | | |
|---|---|---|---|---|
| 4,580,149 A | * | 4/1986 | Domoto et al. | ................ 347/61 |
| 4,872,028 A | * | 10/1989 | Lloyd | ........................... 347/14 |
| 4,894,709 A | | 1/1990 | Phillips et al. | |
| 4,921,041 A | * | 5/1990 | Akachi | ................... 165/104.29 |
| 5,099,311 A | | 3/1992 | Bonde et al. | |
| 5,219,020 A | * | 6/1993 | Akachi | ................... 165/104.26 |
| 5,400,061 A | * | 3/1995 | Horio et al. | ................... 347/55 |
| 6,148,635 A | | 11/2000 | Beebe et al. | |
| 6,200,536 B1 | | 3/2001 | Tonkovich et al. | |
| 6,564,861 B1 | * | 5/2003 | Miyazaki et al. | ...... 165/104.29 |
| 6,672,373 B2 | * | 1/2004 | Smyrnov | ............... 165/104.26 |
| 2001/0040022 A1 | * | 11/2001 | Hao | .......................... 165/80.3 |
| 2004/0104468 A1 | | 6/2004 | Suzuki et al. | |

FOREIGN PATENT DOCUMENTS

WO    WO 02/080270    10/2002

OTHER PUBLICATIONS

Honda, H., et al. Enhanded Boiling Heat Transfer from Electronic Components by Use of Surface Microstructures, Experimental Thermal and Fluid Science, vol. 28, 2004, pp. 159-169.

Thome, J.R., et al. Heat Transfer Model for Evaporation in Microchannels. Part 1: Presentation of the Model, International Journal of Heat and Mass Transfer, vol. 47, pp. 3375-3385.

* cited by examiner

*Primary Examiner*—Tho Duong
(74) *Attorney, Agent, or Firm*—Clifford W. Browning; Krieg DeVault LLP

(57) ABSTRACT

A heat transfer assembly for transferring heat from a heat generating device to a circulating fluid, said heat transfer assembly comprising
  an evaporator device having at least one microchannel formed therein, in thermally conductive contact with said heat generating device,
  a condenser device,
  actuating means and manifold means for circulating said fluid between said evaporator device and said condenser device,
  wherein said heat transfer assembly further comprises a bubble generator capable to create bubbles in said at least one microchannel at a controlled frequency.

19 Claims, 9 Drawing Sheets

BUBBLE GENERATOR

FIELD OF INVENTION

The present invention concerns a bubble generator for generating bubbles within a tubular liquid flow, a heat transfer assembly for transferring heat from a heat generating device to a circulating fluid and a process for cooling a heat generating electronic device by means of a cooling liquid.

There is a need for small and efficient cooling systems in the thermal management of high heat flux electronic devices, electronic switches and motors, CCD camera elements, infrared cameras, laser diodes, etc., to dissipate the heat and eliminate hot spots. There is also a need for cooling systems in other kinds of high heat flux devices, like high speed train brakes, micro-reactors for chemical processing, fuel cells, micro-heat pumps or micro-refrigerators.

BACKGROUND OF INVENTION

Most cooling systems of electronic devices, such as chips in laptop or desktop computers, use forced convection of air associated with large radiator surfaces to remove the heat dissipated and to decrease the operating temperature of the processor. The clock speed of a processor, its reliability and lifetime are strongly dependent on these temperatures. With high heat flux sources and/or when the volume available is small, forced convection of air is not sufficient to remove large quantities of heat. New processors exhibit heat fluxes higher than 100 W/cm$^2$. For these applications, more efficient cooling systems are based on the circulation of a liquid, as disclosed for example in Phillips et al. U.S. Pat. No. 4,894,709, or in Bonde et al. U.S. Pat. No. 5,099,311. Some cooling systems are based on the vaporization of a cooling liquid inside a microstructure, in close contact with the heat source. Such cooling systems are disclosed for example in Tonkovich et al. U.S. Pat. No. 6,200,536, or in Parish et al. WO 02/080270 A1. A further example of a micro-refrigeration system comprising an evaporator and a condenser based on micro-channel heat exchange elements is disclosed by Beebe et al. in U.S. Pat. No. 6,148,635.

This concept for heat removal is based on evaporation of fluids in microchannels. Some authors propose a somewhat arbitrary classification into microchannels, having internal diameters of between 50 µm and 600 µm, and minichannels having diameters of between 600 µm and 3 mm. The inventors consider that these figures do not constitute absolute thresholds, and that according to a functional threshold criterion, a microchannel is a small diameter channel in which the vapor bubbles are confined by the size of the channel and grow primarily in length once their cross-sectional diameter have nearly reached the internal diameter of the channel. Typically, this occurs indeed in channels smaller than about 2–3 mm in size. A microchannel may be round, square, triangular or of any other cross-sectional geometrical shape, and straight in length or have a complex loop geometry. A microchannel element may consist of one, usually meandering microchannel, or of several or many microchannels arranged side by side. The microchannel element may be one integral piece or may be an assembly of individual tubes into one multichannel element. This element may be arranged in thermally conductive contact with the device to be cooled. Alternatively, the microchannel(s) may be integrated directly into the device to be cooled.

Due to the presence of small cavities in the wall of the microchannel(s) and the high wetting capability of the working fluids envisaged in such micro-evaporators, the liquid superheat $\Delta T_{sat,i}$ associated with the initiation of boiling is quite high, up to 50° C. Thus, during transient behavior, this temperature overshoot is a penalizing phenomenon that creates thermal stresses and obligates electronic component manufacturers to reduce the performance of the chips in order to reduce this temperature peak that precedes the efficient heat transfer by phase change.

Honda and Wei (Exp. Thermal and Fluid Science, 28, 159–169, 2004) have summarized the challenges that must be solved to use a two-phase micro-heat exchanger for such applications: (i) mitigation of the wall temperature overshoot at boiling incipience, (ii) enhancement of the nucleate boiling heat transfer coefficient, (iii) increase of the critical heat flux (CHF). For pool boiling, Honda and Wei noticed that surface enhancement permits to lower the boiling incipience superheat but does not work if subcooled conditions are reached because in this case the liquid floods the microcavities. The most effective way to reduce $\Delta T_{sat,i}$ is then to use a liquid completely saturated with a incondensable gas as coolant, but this pool boiling solution is not adaptable in microchannel flows because pure fluid is needed in the loop and because it is also difficult to implement surface treatment without increasing roughness. Until now, no reliable solution has been found to this problem inside small channels.

The present invention proposes a solution to solve these problems, in particular the temperature overshoot at boiling incipience.

SUMMARY OF THE INVENTION

A first object of the invention is a bubble generator for generating bubbles within a tubular liquid flow, comprising means for generating one bubble at a pre-determined location within said tubular liquid flow, means for repeating periodically said bubble generating step at said location, and means for controlling the frequency of said periodical bubble generating step, wherein said tubular liquid flow is carried out within a microchannel, and wherein said bubbles consist of vapor of said liquid.

Said frequency may be a pre-determined fixed frequency of between 5 Hz and 500 Hz, in particular of between 20 Hz and 60 Hz.

Said frequency may be variable and adjustable between 5 Hz and 500 Hz, in particular between 20 Hz and 60 Hz. Preferably, said frequency is adjustable by a control unit in function of a repetitive temperature measurement of one or several selected areas of the device.

The bubble generator may comprise wire means for connecting said bubble generating means to a control circuit providing periodically varying electric energy and transducer means connected to said wire means, capable to transfer said electric energy to said liquid in form of thermal and/or mechanical energy. Said transducer means may comprise an electrically resistive part, or a capacitor. Said transducer may be an electrohydrodynamic transducer. Said transducer may be a sonic or ultrasonic transducer. Said transducer may be a piezo electric transducer.

The bubble generator may comprise a laser impacting said location, and a shutter cutting off the beam of said laser at said frequency.

The bubble generator may comprise a reservoir containing the vapor of the cooling liquid and port means alternately cutting off and communicating with said micro-channel.

The bubble generator may be located in the flow path within said microchannel.

Preferably, the bubble generator is located in a nucleation chamber in fluid communication with the flow in said microchannel. The nucleation chamber may be located in the wall of said microchannel.

A second object of the invention is a heat transfer assembly for transferring heat from a heat generating device to a circulating fluid, said heat transfer assembly comprising an evaporator device having at least one microchannel formed therein, in thermally conductive contact with said heat generating device, a condenser device, actuating means and manifold means for circulating said fluid between said evaporator device and said condenser device, wherein said heat transfer assembly further comprises a bubble generator capable to create bubbles in said at least one microchannel at a controlled frequency with the features as aforesaid.

Preferably, the heat transfer assembly comprises at least one temperature sensor sensing a temperature of a wall of said evaporator device, and the frequency of said bubble generator is adjusted in function of said sensed temperature.

Other objects, features and advantages of the present invention may be better understood by reference to the following description of specific embodiments taken in connection with accompanying drawings.

BRIEF DESCRIPTION OF THE DRAWINGS

FIG. 10b is a schematic enlarged view of an embodiment of bubble generator, used in the test assembly represented in FIG. 10a.

FIG. 12c is a magnified cross-sectional view of a further embodiment similar to FIG. 12a.

DETAILED DESCRIPTION OF THE INVENTION

Figure 1:
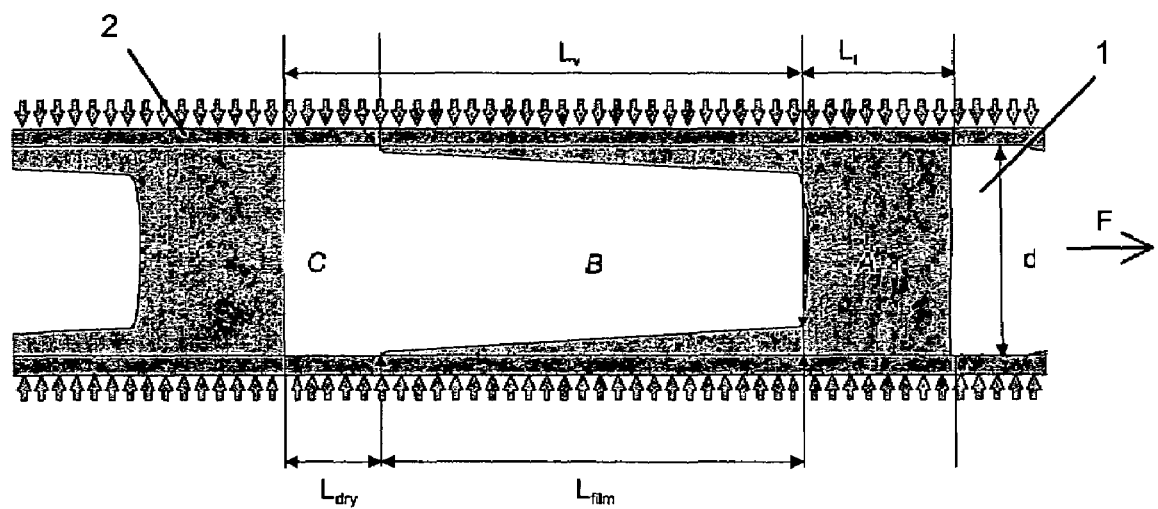
FIG. 1 is a schematic representation of an elementary pair [liquid slug+bubble] according to a three-zone heat transfer model in a longitudinal section of a microchannel.

A phenomenological model that describes the complex heat transfer process during evaporation inside microchannels has been developed by the inventors. This model demonstrates that the heat transfer process is controlled by three heat transfer mechanisms, the progress thereof being schematically illustrated in FIG. 1: single-phase heat transfer to a passing liquid slug A of length $L_l$, followed by evaporative two-phase heat transfer to the front part B of length $L_{film}$ of the elongated vapor bubble behind the liquid slug, a thin evaporating liquid film being still present along the walls 2 of the micro channel 1, and then single-phase heat transfer to a dry vapor slug C of length $L_{dry}$; the total length of the elongated bubble being $L_v=L_{dry}+L_{film}$.

Figure 2:
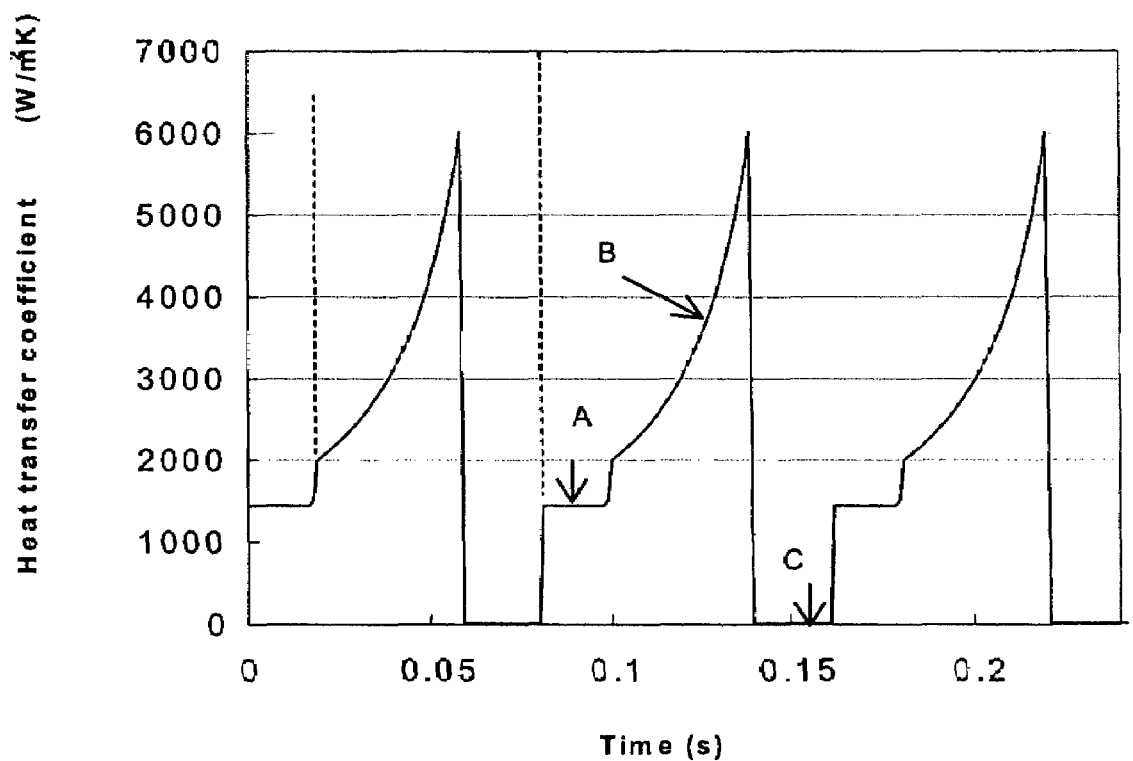
FIG. 2 is a graph of the local heat transfer coefficient v. time, inside a single-tube microchannel at the location where the vapor quality is x=0.3.

There is a cyclic variation in the local heat transfer coefficient with time that is strongly influenced by the frequency of the said process. FIG. 2 displays an example of the predicted cyclic variation in the local transient heat transfer coefficient as a function of time for these three heat transfer mechanisms, illustrating the high effectiveness of the evaporation process of the elongated bubble front part B, the less effective heat removal by the liquid slug A, and the nearly completely ineffectiveness of the vapor slug C for heat removal. If vapor bubbles are generated spontaneously by phenomena like nucleation in microcavities in the walls of the microchannel, it is not possible to control the frequency of generation, nor their growth and/or coalescence, and thus it is not possible to control the respective lengths $L_l$, $L_{film}$ and $L_{dry}$ so as to maximize $L_{film}$ and to minimize or eliminate $L_{dry}$.

Bubbles created artificially, according to the present invention, do not normally coalesce with one another nor split into two, due to the small diameter d of the microchannel 1. Thus, the frequency of bubble formation by the bubble generator determines the frequency of bubbles passing in the direction of arrow F within and at the outlet of the heated zone of microchannel 1. Since the frequency of bubble formation controls the cycle time and also determines whether a dry vapor slug is present or not, active control of the frequency of bubble formation is a new way to (i) optimize the heat transfer process in order to maximize the heat removal rate and to (ii) adapt the operation of the cooling system to the heat removal demand of the system being cooled, which may be constant or change with time.

Figure 3:
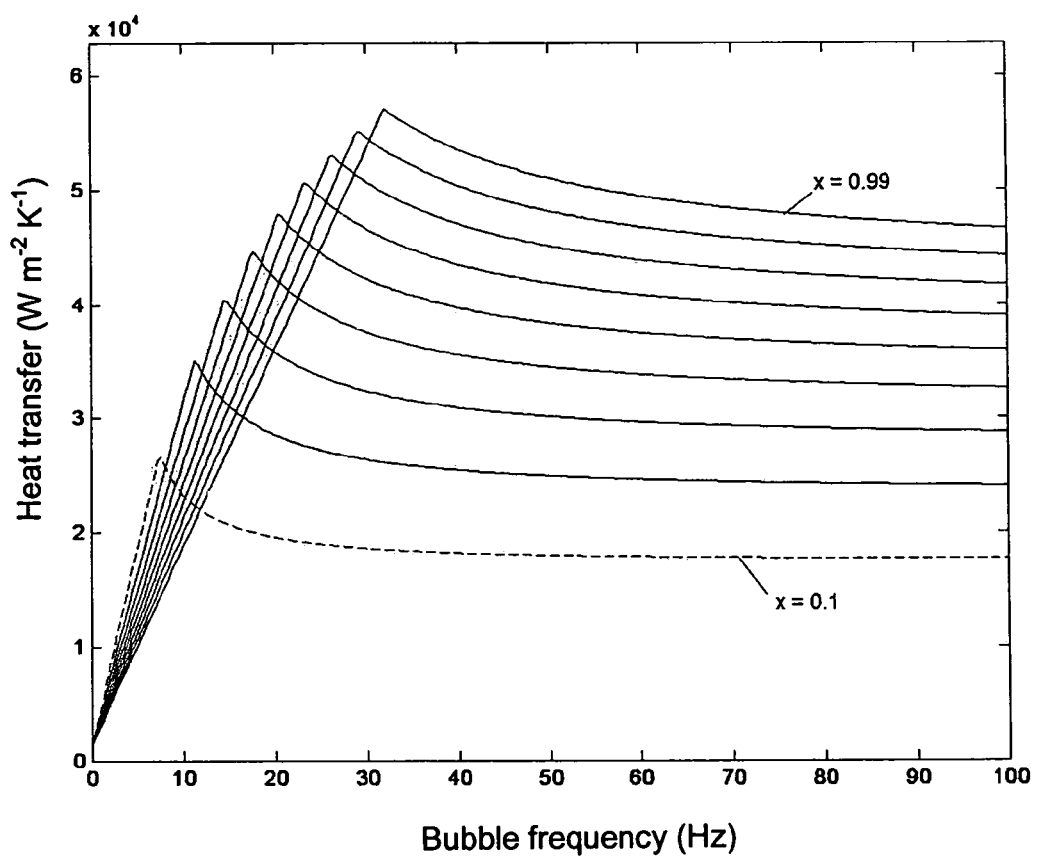
FIG. 3 is a graph of the internal heat transfer coefficient, predicted by the three-zone model, v. the bubble formation frequency for different values of the vapor quality x and for otherwise fixed conditions.

Utility of optimizing bubble formation frequency is illustrated in FIG. 3. Each curve represents the time averaged heat transfer coefficient as a function of bubble formation frequency at a particular value of the vapor quality, i.e. the ratio vapor flow/total flow at a local location along the tube. Hence, it appears that at a particular bubble formation frequency, the time-averaged heat transfer coefficient for the above cyclic process reaches a single maximum for pre-defined flow conditions. Thus, to maximize heat transfer, one has to actively control the frequency at which bubbles are formed, i.e. at a value between 5 Hz and 35 Hz, in the example illustrated by FIG. 3. Furthermore, since the optimum bubble passage frequency is also a function of the fluid flow rate, by optimizing both the bubble formation frequency and the flow rate of the coolant being evaporated, the highest heat removal rate can be determined so as to maximize cooling of the heat-dissipating device. Since the cooling duty for this device may change in time—for instance consider a computer chip that is functioning at various levels of power consumption—the control of the bubble formation frequency alone or in conjunction with control of the fluid flow rate, allows an energy efficient heat removal process to be implemented.

To maximize the internal heat transfer coefficient by finely tuning the bubble frequency, no parasite bubble formation, in particular from wall microcavities, should interfere with the bubble formation from the bubble generator. Thus, the walls of the microchannels should be: (i) treated, for example chemically, to obtain a smoother finish of their surfaces, and (ii) thick enough to be less sensitive to transient time variation of the heat transfer coefficient, to smooth out transient local temperature overshots. Those skilled in the art will notice that these conditions are contrary to the current practice teaching to make cooling device walls as thin as possible to enhance the heat transfer and to enhance spontaneous bubble formation by means of rough channel walls.

Furthermore, optimizing and controlling bubble formation may prevent maldistribution in multi-microchannel evaporators. The two-phase pressure drop resisting flow in single and multiple microchannels is directly related to these mechanisms, and hence the flow resistance can be regulated in an individual channel of a multi-microchannel evaporator by controlling the bubble frequency and thus used as a means to balance the inlet flow to multiple microchannels situated in parallel to obtain a more uniform distribution of the flow or to impose a higher flow rate in one or more channels to increase local cooling to overcome local hot spots in the device to be cooled.

FIG. 3 suggests further operative flow conditions of the cooling fluid in a microchannel, providing a stable and relatively high, whereas not maximal, time averaged heat transfer coefficient. As shown by FIG. 3, at low bubble formation frequency, the heat transfer coefficient strongly increases with increasing frequency, but at frequencies above the frequency corresponding to the maximal value of the heat transfer coefficient, its value decreases only weakly and remains relatively high, i.e. above 70% of the maximal value. Thus, active bubble generation at a frequency above the optimum frequency, e.g. at 50 Hz or 60 Hz, provides a good heat transfer coefficient, whose value is insensitive to additional spontaneous bubble generation, e.g. from wall microcavities.

Figure 4A:
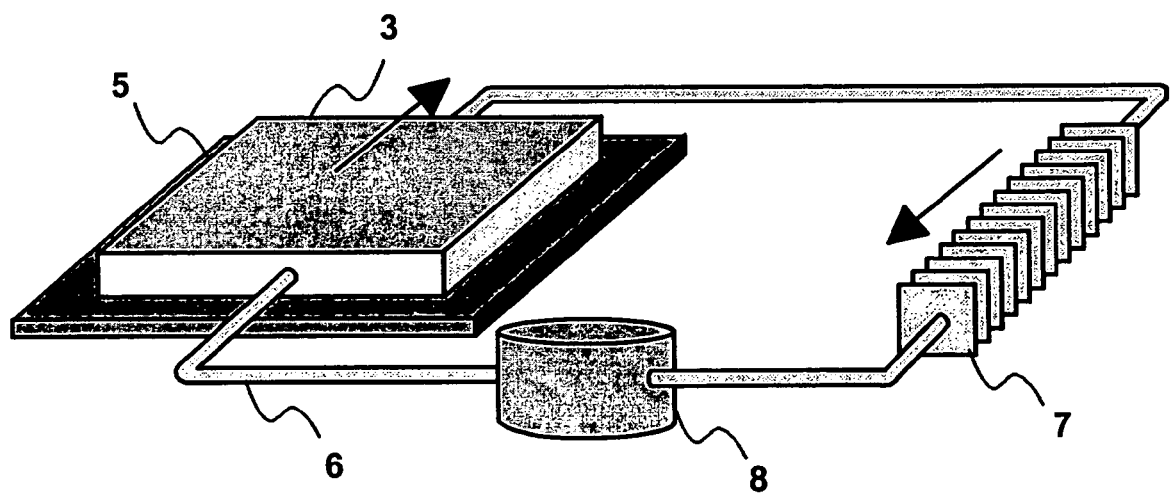
FIG. 4a is a schematic view of a heat transfer assembly loop used to create a fluid circulation through a micro-evaporator.
Figure 5A:
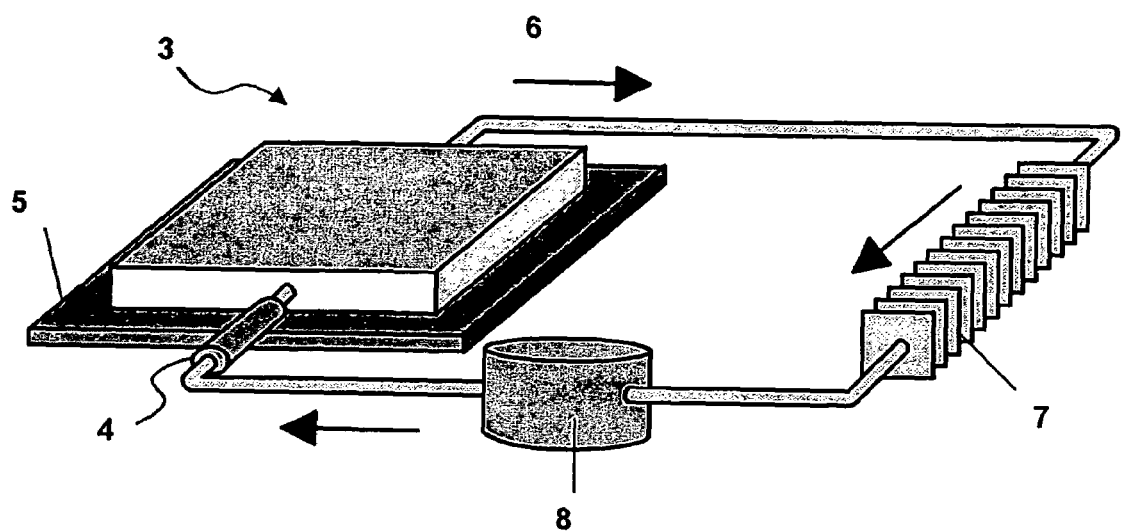
FIG. 5a is a schematic view, similar to FIG. 4a, with a bubble generator device located outside, at the inlet the micro-heat-exchanger.

FIGS. 4a and 5a show schematic views of heat transfer assemblies used to cool a heat generating device, like an electronic chip 5. An evaporator, here a microevaporator 3, is in intimate heat conductive contact with the chip 5. Inlet and outlet manifold 6 connect the evaporator 3 to a condenser 7. The loop is actuated by a micropump 8. Such condensers 7 and micropumps 8 are known in the art.

Figure 4B:
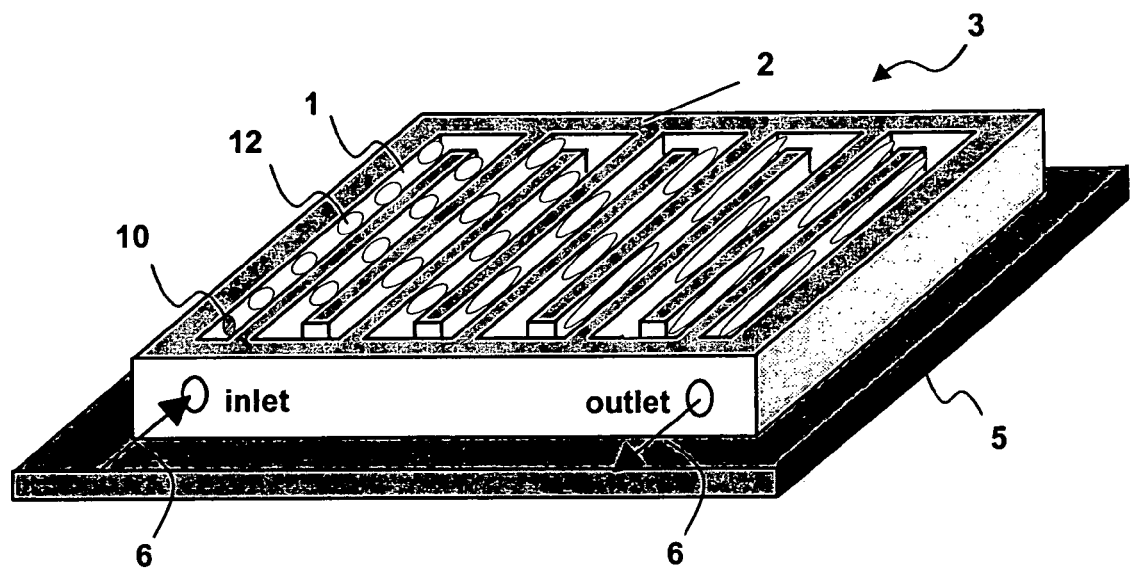
FIG. 4b is a schematic view of a micro-evaporator with a single microchannel equipped with a bubble generator device, the upper part of the housing of the evaporator being removed for explanatory purposes.
Figure 4C:
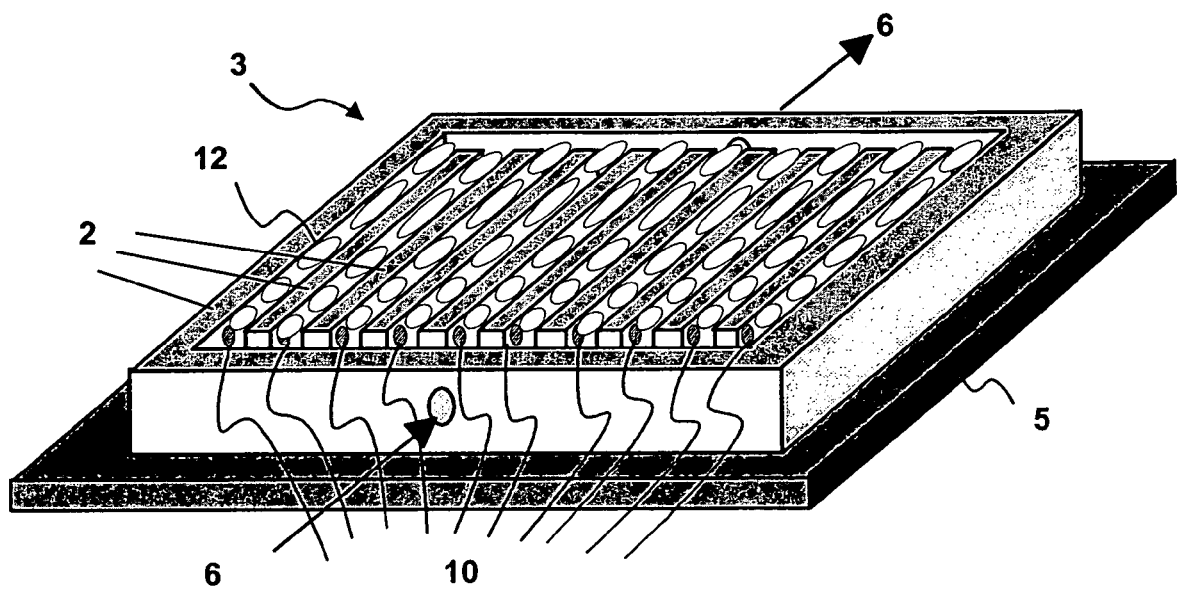
FIG. 4c is a schematic view of a micro-evaporator with multiple microchannels, each equipped with a bubble generator device, the upper part of the housing of the evaporator being removed for explanatory purposes.
Figure 5B:
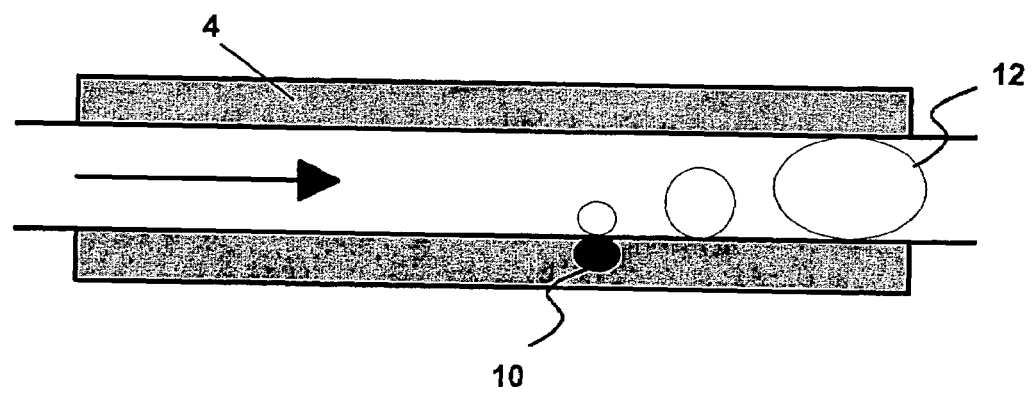
FIG. 5b is a magnified partial view of FIG. 5a, showing the bubble generation inside the device at the inlet of the micro-heat-exchanger.

FIG. 11 and FIGS. 12a, 12b and 12c present preferred embodiments of a bubble generator 10 integrated in the wall 2 of a microchannel 1. These embodiments may be implemented inside a microevaporator 3, as illustrated schematically respectively by FIGS. 4b and 4c, or outside, in a tube 4 containing a microchannel, arranged at the inlet of the microevaporator 3, as illustrated by FIGS. 5a and 5b.

High thermal conductivity materials are used to manufacture the different parts of the microevaporators 3, like copper, silicon, or other materials doped with nanotubes. These materials permit more than one microchannel layer to be used effectively without increasing the overall thermal resistance, and thus decrease significantly the internal heat flux.

The size of the microevaporator 3 corresponds to the size of integrated heat sinks used with computer chips from $10\times10$ $mm^2$ to $40\times40$ $mm^2$. The hydraulic diameter of the microchannels ranges from about 0.2 to 2 mm and the lengths are below 40 mm. The lengths and the diameters may be larger or smaller, depending upon the working fluid and specific application.

The working fluid arrives at a subcooled or saturation state in the bubble generator 10 of the micro-evaporator. The liquid is preferably superheated to permit a fast growth of the bubbles in order to lower the power consumption. The bubble generator is then just a trigger. The working fluids envisaged are conventional refrigerants, like R-134a, dielectric fluids, like FC-72, water, $CO_2$, glycol or other organic fluids.

In the embodiments shown in FIGS. 11, 12a, 12b and 12c, a nucleation chamber 11 is built inside the wall 2 using etching, engraving, laser cutting, photolithography, or microsandblasting and bonding techniques used in microtechnologies to create the holes and the cavity of the nucleation chamber 11. As an example, the dimensions of the nucleation chamber 11 may be set at $2\times0.15\times0.15$ $mm^3$ but can be adapted, in size and form to the cooling system. Bubbles are created by Joule effect by means of pulsed or alternative current. In the embodiment shown in FIG. 12a, the heated part 13 is a metallic deposition on the surface of the wall of the nucleation chamber 11, connected via connection wires 14 embedded in the wall to a control circuit as described hereunder. The thickness of the heated part 13 is adapted to obtain a sufficient electrical resistance to create a local superheat necessary for bubble nucleation. All the nascent bubbles created during an electric current pulse through the heated part 13 coalesce in the nucleation chamber 11, and the resulting bubble 12 escapes from the chamber 11 through the vapor outlet hole 15. The size of the vapor outlet 15 is adapted to the geometry of the microchannel and the operating conditions. A preferred diameter for the vapor outlet 15 is of about 0.15 mm. In the embodiments shown in FIGS. 12a and 12c, a small inlet connection 16 permits the liquid to flow from the microchannel into the nucleation chamber during the bubble expulsion. A preferred diameter for the liquid inlet 16 is of about 0.1 mm, and in general should have a diameter smaller than the diameter of the vapor outlet to induce a preferential flow into the nucleation cavity. The embodiment represented by FIG. 12b differs from the former by the absence of the liquid inlet. In this case, the liquid arrives through the vapor outlet after the expulsion phase of the bubble 12. In the embodiment represented by FIG. 12c, the heated part 13 is a wire slightly distant from the microchannel wall 2 to avoid heat losses.

The control circuit of the bubble generator is comprised of the following parts:

A current generator. The current generator supplies the energy necessary for the vaporization of the liquid in the nucleation chamber. An external voltage controls the value of the output current, i.e. the size of the bubbles. This kind of device is widely known in electronics and can be built, for example with an LM117 integrated circuit, from National Semiconductor.

A pulse generator to control the bubble frequency. For example, the XR-2206 integrated circuit from Exar Corporation is a monolithic function generator integrated circuit capable of producing high quality sine, square, triangle, ramp, and pulse waveforms of high-stability and accuracy. The output waveforms can be both amplitude and frequency modulated by an external voltage. Frequency of operation can be selected externally over a range from 0.01 Hz to more than 1 MHz.

A Darlington transistor to link the current generator to the pulse generator. For example, the TIP120 NPN Silicon Power Darlington from Power Innovations.

A controller linked to the measurement of the temperature of the device and of the eventual subcooling of the flow. This controller gives a control voltage to the current generator and to the pulse generator. The values of the controlled voltage will be proportional of the emf voltage delivered by the temperature measurement junction P-N (embedded in the CPU) or a platinum resistance thermometer, or thermocouples. The proportional law must be adapted for each design.

The active generation and control of the bubble formation frequency can be implemented by a variety of microdevices and control schemes. For instance, a micro-capacitor can be used to cyclically discard its stored energy to nucleate a bubble at or near the entrance of a microchannel or anywhere along its length. Electronic control of the recharging of a battery of capacitors and their discharge frequencies provide active control of the bubble formation frequency globally to all channels or individually to each channel of a multichannel microevaporator. It is possible to implement these bubble generator devices directly by film deposition during the chip fabrication or to create the bubble directly at an inlet device of the microevaporator (FIG. 5).

Without being limited to the examples hereunder, the bubbles can be created by one or by a combination of the following techniques:

(a) Electrical heating (joule effect) of a part of the wall (in contact, deposed inside or outside, or an inserted material layer) from natural or artificial nucleation cavity sites.

(b) Local heating of a device (wire, solid) inserted in the flow in one, all or any fraction of the microchannels including their inlet header or inlet feed line.

(c) Pulsation of a laser impacting the micro-exchanger wall.

(d) Local sound or ultrasound generation, vibration or oscillation.

(e) Local cavitation formation from a natural or an artificial cavity in the wall due to pressure decrease.

(f) Local generation by electrohydrodynamic effect (EHD).

(g) Local injection of vapor, with a pump, piezo-electric system, pressure difference, capillarity, etc.

The following example demonstrates the suppression of the temperature overshoot at boiling incipience in a microchannel by means of active bubble generation.

EXAMPLE

Figure 10A:
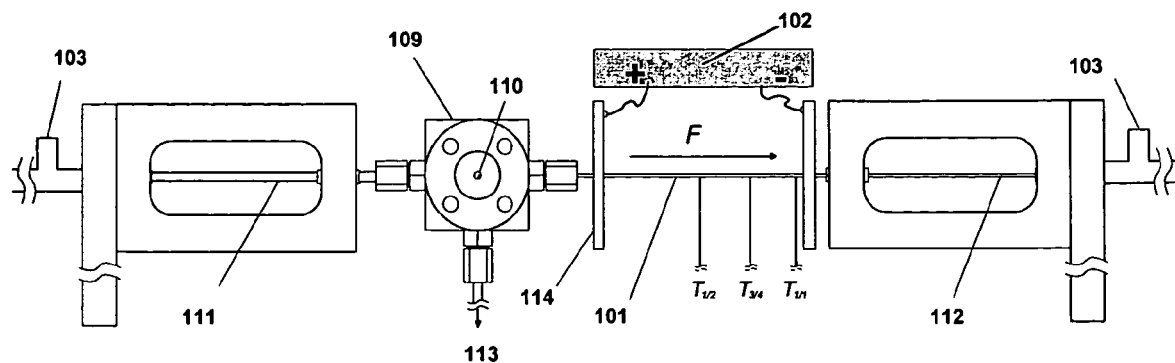
FIG. 10a is a schematic view of a test assembly.

The effect of the invention has been tested on a test assembly represented in FIG. 10a. The test section tube 101 is a stainless steel—AISI304 —single tube with a 0.5 mm internal diameter and a 0.7 mm external diameter. The 60 mm long test section, represented in FIG. 10a was heated, through two copper clamps 114, by direct current with a stabilized power supply 102 monitored by a control PC. The saturation conditions were calculated from the value given by the absolute pressure transducers 103 at the inlet and outlet of the test section. Three K-type 0.25 mm thermocouples were soldered to the upper surface of the test tube at three different locations from the inlet, in the middle (1/2), at ¾ of the length and at the outlet (1/1).

Figure 10B:
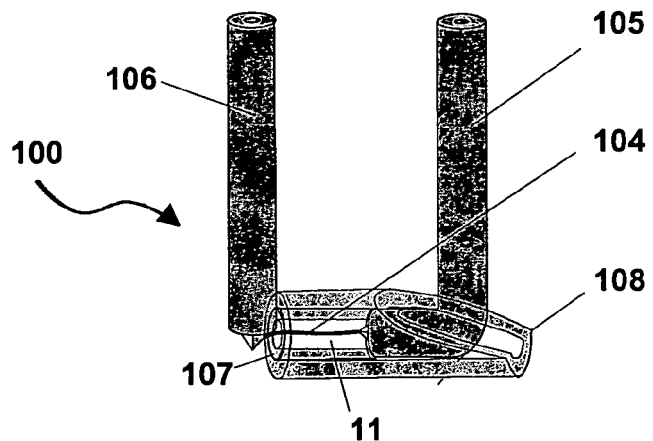
Figure 11:
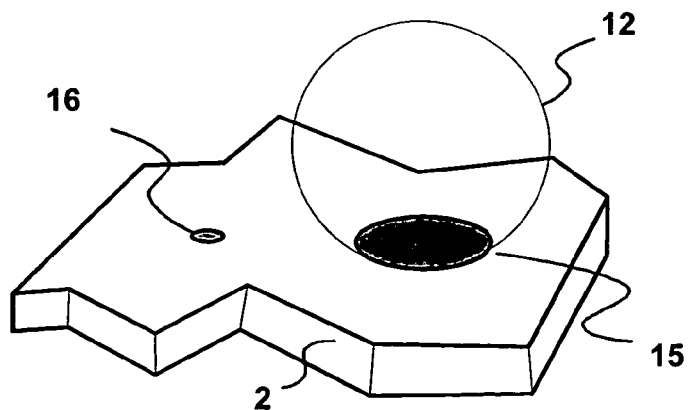
FIG. 11 is a schematic view of a preferred implementation of a bubble generator.
Figure 12A:
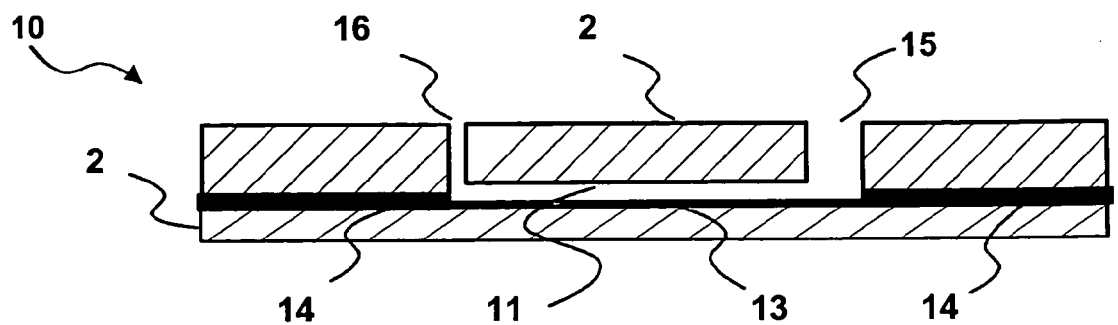
FIG. 12a is a magnified cross-sectional view of FIG. 11.
Figure 12B:
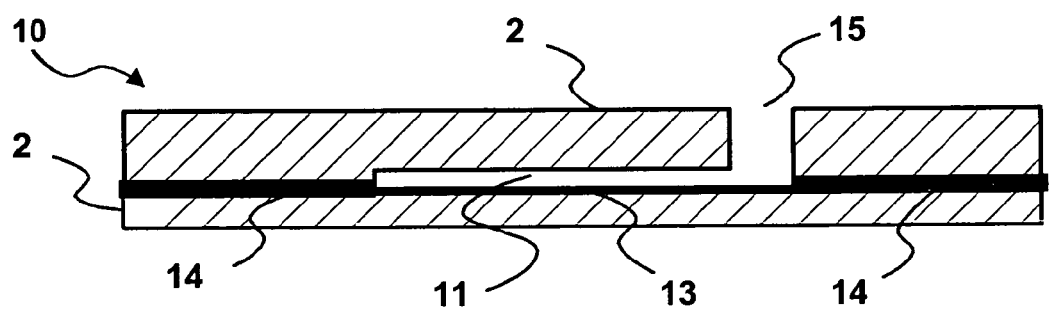
FIG. 12b is a magnified cross-sectional view of an embodiment similar to FIG. 12a except the absence of a liquid inlet.
Figure 12C:
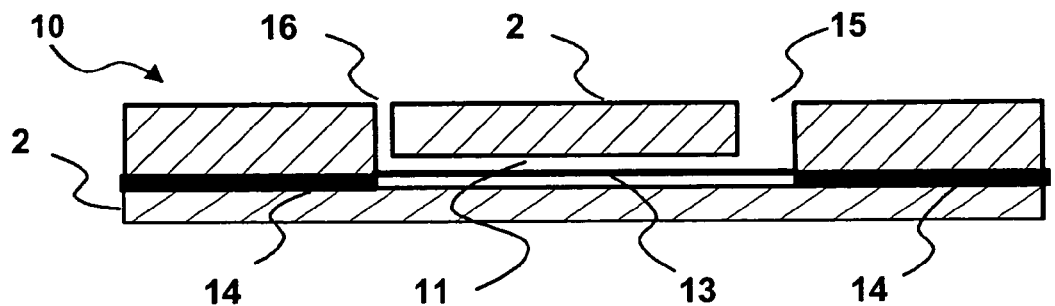

The bubble generator 100 is represented in FIG. 10b. The bubble generator is composed of a 0.025 mm diameter platinum wire 104 soldered inside two copper tubes 105, 106, with an external diameter of 0.25 mm and an internal diameter of 0.05 mm. One of the copper tubes, 105, is L-shaped to force the bubble to be expulsed in a privileged direction. Two PTFE minitubes 107, 108 of 0.15 mm and 0.4 mm internal diameter were placed around the platinum wire 104 in order to form the nucleation cavity 11. The orientation of the platinum wire 104 is given by the angle of the bended part of the L-shaped copper tube 105. The length of the platinum wire 104 is 1 mm. The bubble generator 100 is arranged in the fluid flow, substantially in the central part of the inlet tube within a housing 109. The inlet tube (not shown) and the housing 109 are equiped with wires 113 to the control circuit (not shown). A sight glass 110 allows to monitor the bubble formation. Two glass tubes 111, 112, upstream and downstream of the test section, permit to monitor the fluid flow.

Figure 6A:
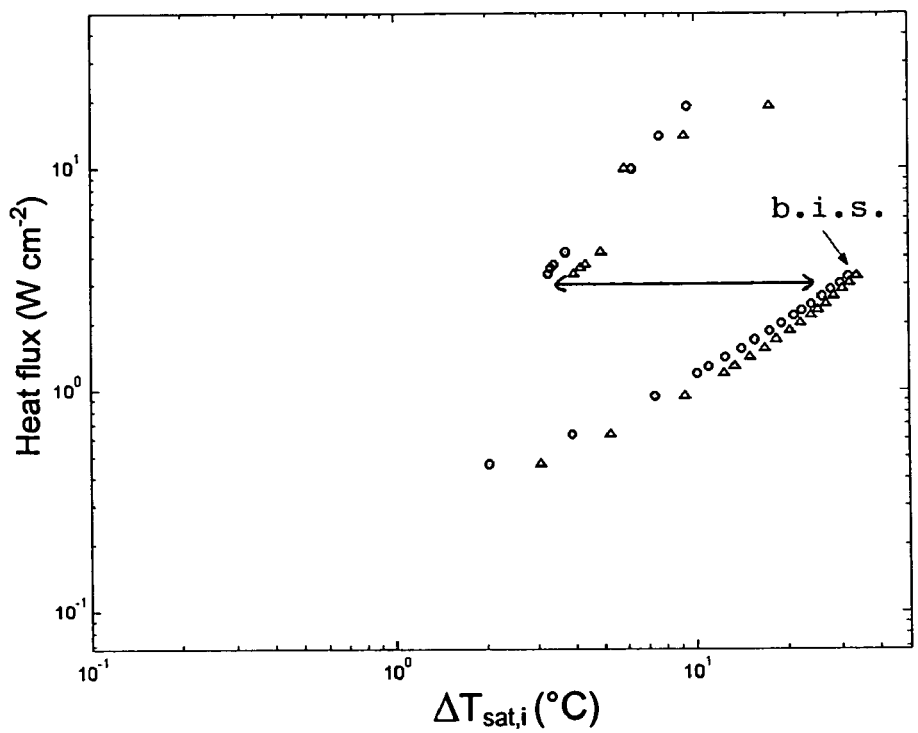
FIG. 6a is a graph of the local heat flux vs. the wall superheat, without use of a bubble generation device, at two locations in a tubular test section, respectively in the middle (○) and at ¾ (Δ) of the length of the test tube.

A first experiment was realized without active bubble generation, with a flow of liquid refrigerant R134a with a mass velocity of 400 kg/m²/s, heated directly by joule effect up to a heat flux of 200 kW/m², by small increments in the heat flux. In FIG. 6a, the curves represent this evolution at two different locations; at the middle (1/2) and at ¾ of the length of the test tube from the inlet. The results exhibit a strong temperature overshoot, corresponding to a boiling incipience superheat (b.i.s.) of 34 K, from the forced liquid only convection region to the two-phase region.

The following results presented in FIG. 6b, FIG. 7, FIG. 8 and FIG. 9 have been obtained with the embodiment of the bubble generator shown in FIG. 10b. For these tests, the current in the wire was 0.72 A and the duration of the pulses 8 ms, i.e. a maximum value of power of 70 mW.

A second experiment was realized, but in this case the above-described bubble generator was used, with bubbles generated at a frequency of 20 Hz. The platinum wire was heated by joule effect during short time steps. Stabilized electrical current was supplied by the stabilized power supply as described above. The length of the electrical current pulses $t_{length}$ and the delay between two-pulses $t_{delay}$ were controlled via a commercial Pulse Generator connected to the power supply via a Darlington transistor. This system sets the energy given to the bubble, i.e. controls the frequency and the size of the bubbles created for a given value of the liquid subcooling and mass velocity. It is important to note that several nascent bubbles are created along the platinum wire during each cycle. The PTFE confinement tube 107 forms a nucleation chamber 11 that induces a coalescence of all these nascent bubbles and the expulsion of only one bubble of the desired size.

Figure 6B:
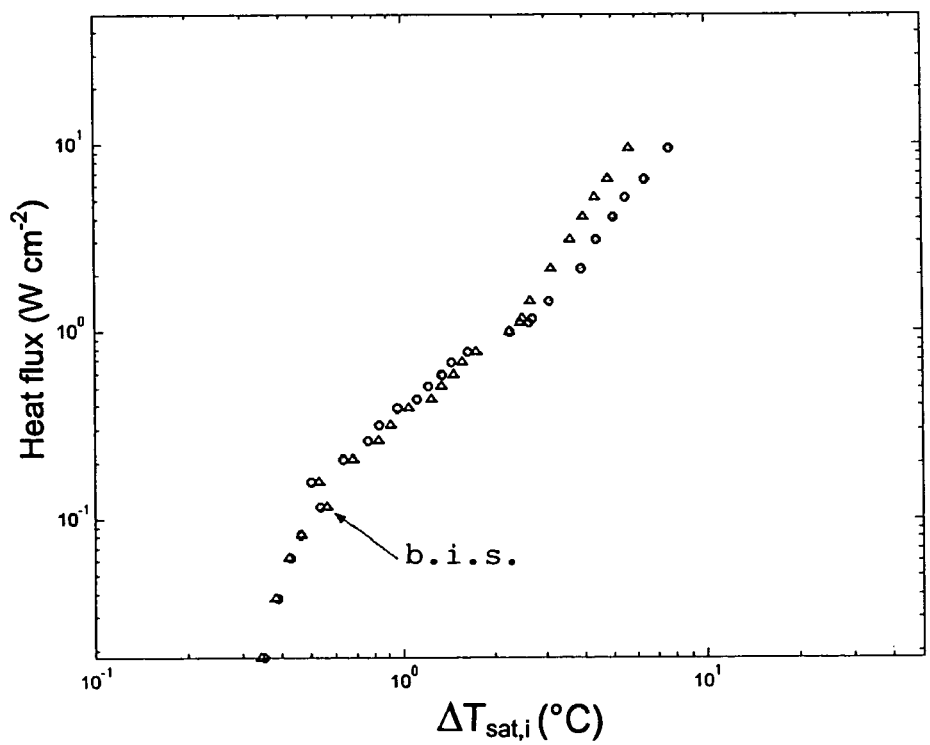
FIG. 6b is a graph of the local heat flux v. the wall superheat of the same tubular test section, with a bubble generation at a frequency of 20 Hz at the inlet of the tube, at the same locations, in the middle (○) and at ¾ (Δ) of the length respectively.

In this experiment, represented by FIG. 6b, the transition between the convective region and the boiling region is smoothed; a temperature overshoot corresponding to the boiling incipience superheat of only 0.6 K is obtained, and hence nearly completely suppressed. This boiling promotion effect is novel: the invention permits not only a reduction but a quasi-suppression of the temperature overshoot inside the heated tube.

Figure 7:
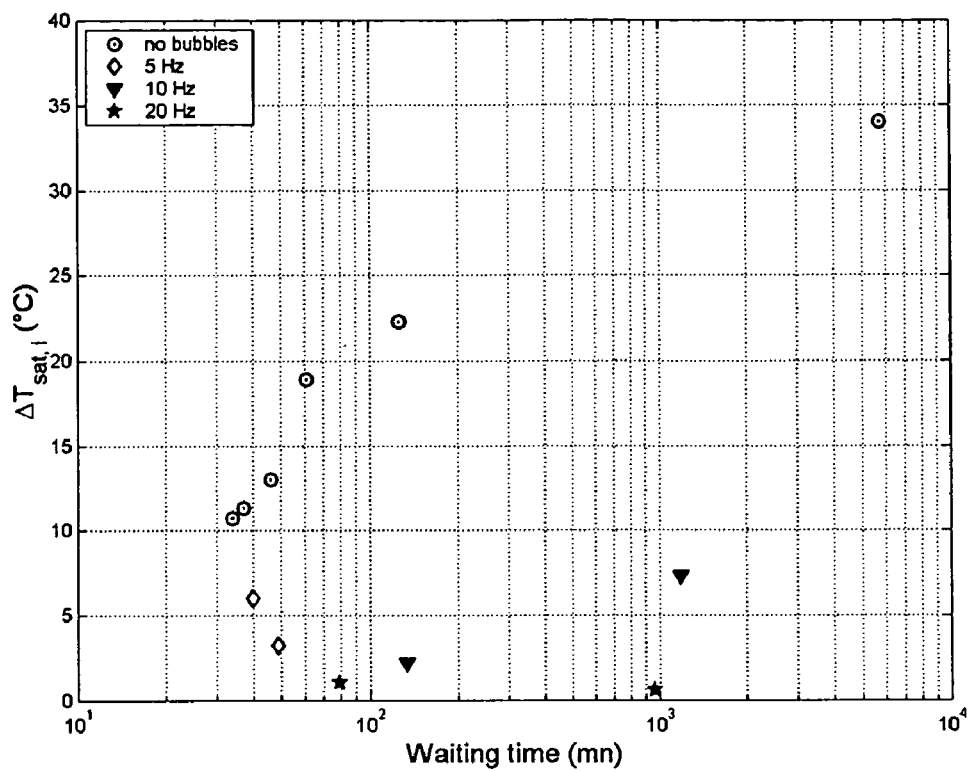
FIG. 7 is a graph of the boiling incipience superheat v. the time, in minutes, between two tests.

FIG. 7 gives a further illustration of the effect of active bubble generation at the inlet of the test section on the boiling incipience superheat, i.e. the temperature overshoot. It is believed that the boiling incipience superheat is roughly inversely proportional to the radius of the vapor bubble embryos trapped in the surface defects of the tube wall. When the tube remains in subcooled conditions during a long time, these vapor embryos condense and only small ones survive, leading to a very large nucleate boiling superheat when the tube is heated again. FIG. 7 shows this increase of $\Delta T_{sat,i}$ v. the waiting or immersion time, i.e. the time between the end of a test and the starting of boiling in the next test. Without using active bubble generator, $\Delta T_{sat,i}$ ranges from 10.7 to 34 K. When the invention is used, the corresponding boiling incipience superheat is considerably lowered. In particular with a bubble generator at a frequency of 20 Hz, after one day of subcooling, $\Delta T_{sat,i}$ is about 1/50 th in comparison with that of a tube that is merely heated without bubble generation. For these latter tests, the value of the subcooling was near 0.4 K.

Figure 8:
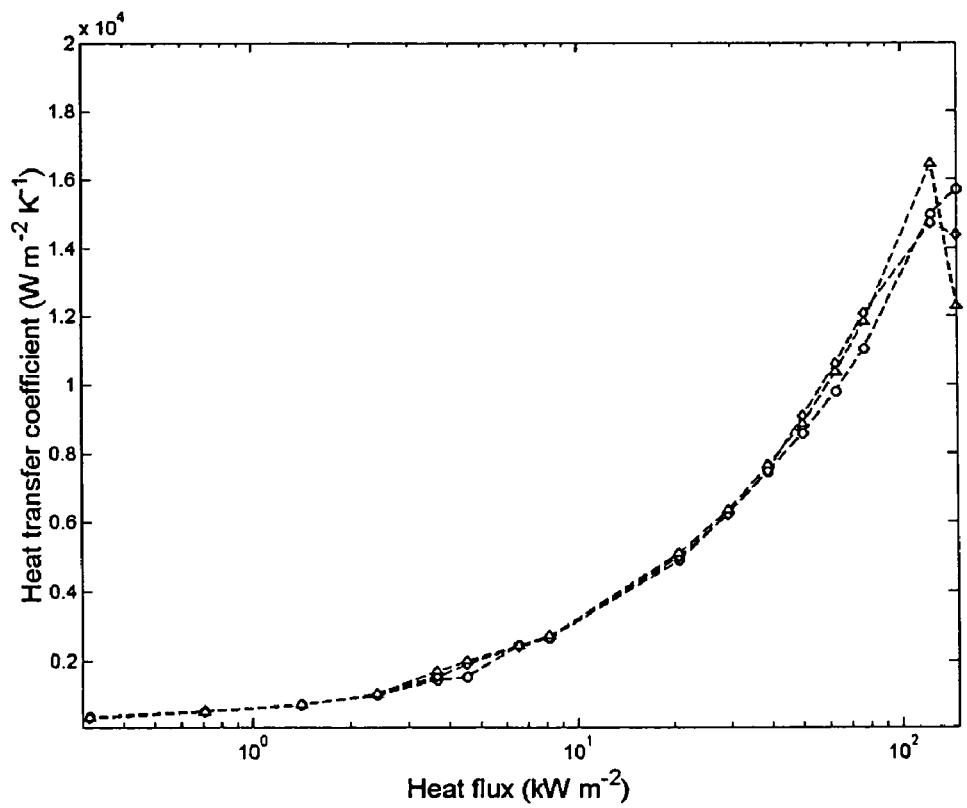
FIG. 8 is a graph of the internal heat transfer coefficient v. the heat flux with bubble generation at a 40 Hz frequency, according to the invention, at three locations of the same tubular test section, respectively in the middle (○), at ¾ of the length (◇) and at the end (Δ).

FIG. 8 shows the internal heat transfer coefficient at the same three locations of the test tube as above, v. increasing heat steps, the bubbles being generated at a frequency of 40 Hz, without transition from the forced single-phase flow to the two-phase flow; the hysteresis is suppressed.

Figure 9:
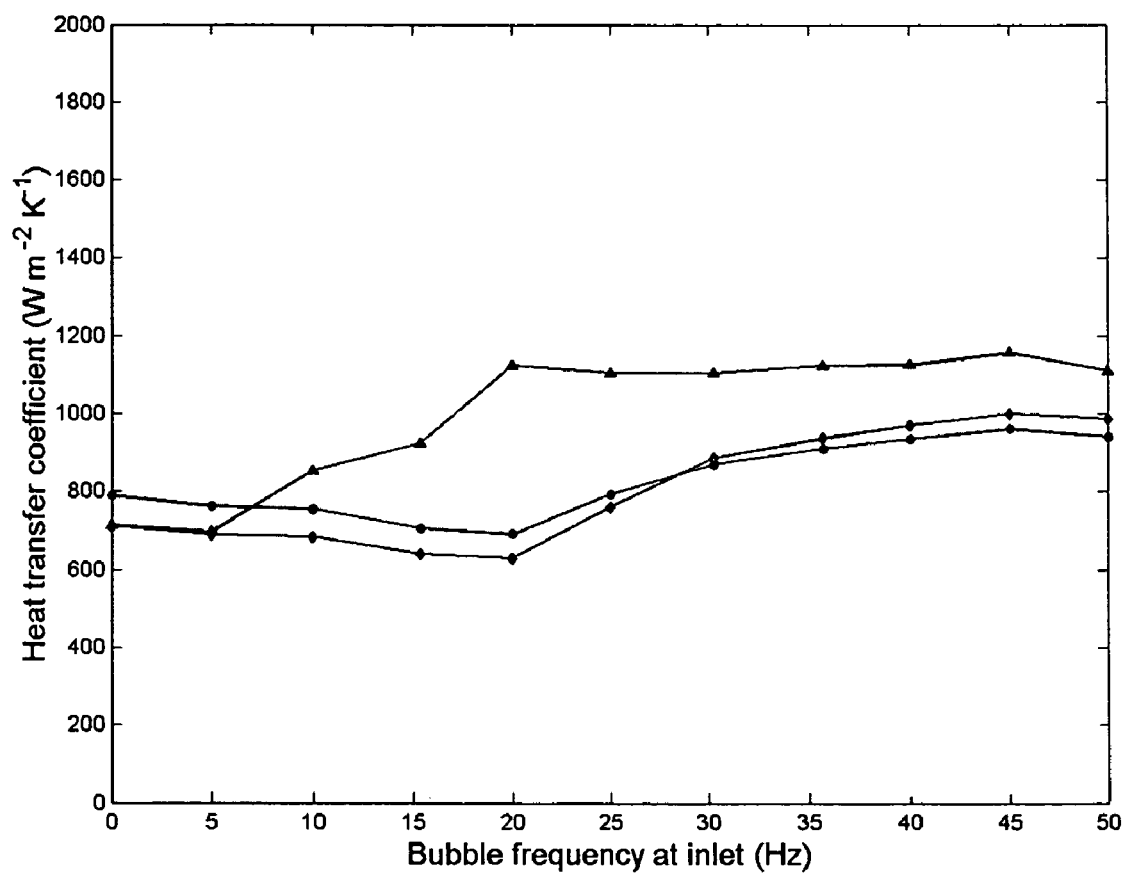
FIG. 9 is a graph of the internal heat transfer coefficient v. the bubble generation frequency, at three locations of the test section, respectively in the middle (○), at ¾ of the length (◇) and at the end (Δ).

FIG. 9 gives a further illustration of the effect of bubble generation at the inlet of the test section on the local heat transfer coefficient at the same three locations, in the middle (1/2), at 3/4 and at the outlet (1/1) of the tested tube. The results prove that a control of the bubble frequency permits an increase in the heat transfer coefficient inside the microchannel. For example, near the outlet, this coefficient is improved by 57% then the frequency is increased from 0 to 25 Hz.

In summary, the invention uses a bubble generator to create bubbles in a microchannel at controlled frequency and size. It is preferred to use a nucleation chamber to produce and expell just one bubble of the desired size at once from the generation of multiple bubbles within the chamber, and to use a bubble generator in subcooled or saturated conditions. This nucleation chamber is an important part of the invention. The size of the bubble must be adapted to the operating condition. For example, in a subcooled environment, the volume of the bubble formed must be sufficient to survive during its displacement to the heated part of the microchannel in the case of the embodiment illustrated in FIG. 5a.

Basically, the invention makes use of the bubble generation frequency to suppress or minimize the temperature overshoot at the onset of the evaporation process, during start-up operation and/or continuous operation, within microcooling channels and confined flows by imposing optimal frequencies of artificially formed bubbles to optimize the local heat transfer coefficient and to increase the critical heat flux (CHF) in adapted microchannels.

Additionally, one may use the bubble generation frequency to avoid the maldistribution in multi-microchannels, that is to say, use the bubble generation frequency to permit an active control of the flow distribution to individual channels or groups of channels in multichannel cooling elements with evaporating working fluids by imposing optimal variation in the local frequency in parallel channels (local increase in pressure drop).

Further, the bubble generator may be used with regulation systems coupled with the hot spot generation source to optimize local heat transfer, thus providing a regulation loop with feedback regulation to increase locally cooling at hot spots. Still further, the bubble generator may be used as "bubble nucleation pump" in combination with channels of expanding cross section in the flow direction to moderate the liquid flow.

The invention claimed is:

1. A heat transfer assembly for transferring heat from a heat generating device to a circulating fluid, said heat transfer assembly comprising
    an evaporator device having at least one microchannel formed therein, in thermally conductive contact with said heat generating device,
    a condenser device,
    actuating means and manifold means for circulating said fluid between said evaporator device and said condenser device,
    wherein said heat transfer assembly further comprises a bubble generator for generating bubbles within a tubular or channel liquid flow, comprising
    means for generating one bubble at a pre-determined location within said tubular or channel liquid flow,
    means for repeating periodically said bubble generating step at said location, and
    means for controlling the frequency of said periodical bubble generating step,
    wherein said tubular or channel liquid flow is carried out within said microchannel, and wherein said bubbles consist of vapor of said liquid.

2. An assembly as claimed in claim 1, wherein said frequency is a pre-determined fixed frequency of between 5 Hz and 500 Hz.

3. An assembly as claimed in claim 1, wherein said frequency is adjustable between 5 Hz and 500 Hz.

4. An assembly as claimed in claim 3, wherein said frequency is adjustable upon a temperature measurement.

5. An assembly as claimed in claim 1 comprising wire means for connecting said bubble generating means to a control circuit providing periodically varying electric energy and transducer means connected to said wire means, capable to transfer said electric energy to said liquid in form of thermal and/or mechanical energy.

6. An assembly as claimed in claim 5, wherein said transducer means comprise an electrically resistive part.

7. An assembly as claimed in claim 5, wherein said transducer means comprise a capacitor.

8. An assembly as claimed in claim 5, wherein said transducer is an electrohydrodynamic transducer.

9. An assembly as claimed in claim 5, wherein said transducer is a sonic or ultrasonic transducer.

10. An assembly as claimed in claim 5, wherein said transducer is a piezo electric transducer.

11. An assembly as claimed in claim 1, comprising a laser impacting said location, and a shutter cutting off the beam of said laser at said frequency.

12. An assembly as claimed in claim 1, comprising a reservoir containing said vapor of said liquid and port means alternatively cutting off and communicating with said microchannel at said frequency.

13. An assembly as claimed in claims 1, wherein said location is located in the flow path within said microchannel.

14. An assembly as claimed in claim 1, wherein said location is a nucleation chamber in fluid communication with the flow in said microchannel.

15. An assembly as claimed in claim 14, wherein said nucleation chamber is located at the wall of said microchannel.

16. An assembly as claimed in claim 15, comprising at least one temperature sensor sensing a temperature of a wall of said evaporator device, and in that the frequency of said bubble generator is adjustable in function of said sensed temperature.

17. A process for cooling a heat generating electronic device by means of a cooling liquid, implementing a heat transfer assembly as claimed in claim 1.

18. A process as claimed in claim 17, wherein said cooling liquid is set in a saturated condition at the inlet of said bubble generator.

19. A process as claimed in claim 18, wherein said frequency of bubble generation is continuously adjusted in function of a temperature measurement.

\* \* \* \* \*